United States Patent [19]

Rolandi et al.

[11] Patent Number: 5,179,300
[45] Date of Patent: Jan. 12, 1993

[54] DATA OUTPUT STAGE HAVING FEEDBACK LOOPS TO PRECHARGE THE OUTPUT NODE

[75] Inventors: Paolo Rolandi, Volpedo; Marco Dallabora, Melegnano; Marco Maccalli, Novate Milanese, all of Italy

[73] Assignee: SGS-Thomson Microelectronics s.r.l., Milan, Italy

[21] Appl. No.: 691,768

[22] Filed: Apr. 26, 1991

[30] Foreign Application Priority Data

Apr. 27, 1990 [IT] Italy ................................ 20157 A/90

[51] Int. Cl.⁵ .................... H03K 17/04; H03K 19/092
[52] U.S. Cl. .................................... 307/443; 307/475; 307/481; 307/451
[58] Field of Search ................ 307/443, 475, 481, 451

[56] References Cited

U.S. PATENT DOCUMENTS

| | | | |
|---|---|---|---|
| 4,490,633 | 12/1984 | Noufer et al. | 307/475 |
| 4,612,466 | 9/1986 | Stewart | 307/443 |
| 4,963,774 | 10/1990 | Masuda | 307/443 |
| 4,988,888 | 1/1991 | Hirose et al. | 307/443 |
| 5,051,625 | 9/1991 | Ikeda et al. | 307/475 |

Primary Examiner—Edward P. Westin
Assistant Examiner—Richard Roseen
Attorney, Agent, or Firm—Seed and Berry

[57] ABSTRACT

A data output stage of the buffer type for CMOS logic circuits, being of the type having at least one pair of MOS transistors associated to drive an output node of said stage, comprises first and second feedback loops which are structurally independent and respectively connected between said node and a corresponding gate electrode of each transistor to precharge said output node at a predetermined value and reduce the noise to ground during the switching phase.

18 Claims, 2 Drawing Sheets

DATA OUTPUT STAGE HAVING FEEDBACK LOOPS TO PRECHARGE THE OUTPUT NODE

DESCRIPTION

1. Technical Field

This invention relates to a data output stage of the buffer type, having low noise features and being intended for CMOS logic circuits and more particularly to a data output stage having two feedback loops to precharge the output node and at least one pair of MOS transistors associated to drive an output node of said stage.

2. Background of the Invention

As is known, data output stages are useful to prevent undesired electric interactions between a driver circuit and a driven circuit.

A first prior approach to the problem of providing such a buffer is disclosed, for example, in European Patent No. EP 0 284 357, to Toshiba. That patent describes the construction of a driver circuit incorporating a large-size CMOS inverter. The use of that inverter as a buffer involves problems from the high sensitivity of the circuit to switching noise.

A second prior approach is disclosed in European Patent No. EP 0 251 910 to Fujitsu, whereby the switching noise of a data output buffer is reduced by driving the gates of the driver through a suitable RC circuit. A major drawback of this approach is the reduced speed of the entire circuit.

Also known are other types of driver circuits which provide for a pre-discharge step of the output, which is brought to a logic high consistent with logics of the TTL type. This pre-discharge step is clocked by an internal clock of the circuit, which is caused to operate prior to enabling the buffer stage. The latter circuit arrangement does afford a reduction in noise on the output being switched from a logic high to a logic low, but has proved ineffective as it is switched the other way.

SUMMARY OF THE INVENTION

According to the principles of the invention, the output node of the control circuit is precharged towards an intermediate voltage between a logic one and a logic zero before the switching step, irrespective of the type of switching.

An output stage for providing this precharge includes structurally independent, first and second feedback loops which are respectively connected between the output node and a corresponding gate electrode of respective transistors that drive the output node to precharge said output node to a predetermined voltage level.

The underlying technical problem solved by this invention is to provide a data output stage of the buffer type, having such structural and functional characteristics so as to reduce the noise to ground during the switching step. This circuit does not have the above-mentioned drawbacks of the prior art.

The exceptional features and advantages of an output circuit stage according to the invention will become apparent from the following detailed description of an exemplary embodiment thereof, given by way of illustration and not of limitation with reference to the accompanying drawings.

DETAILED DESCRIPTION OF THE INVENTION

Figure 1:
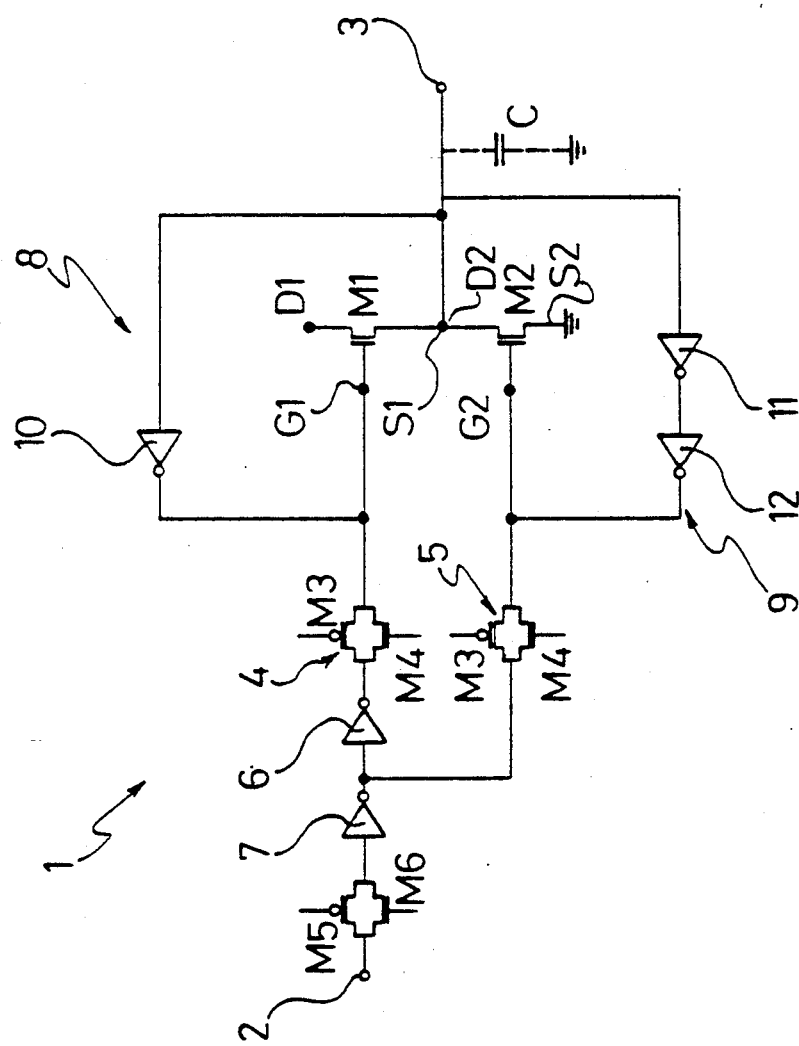
FIG. 1 is a circuit diagram showing schematically the output stage of this invention.

FIG. 1 illustrates a circuit of a data output stage of the buffer type embodying this invention and being intended for high switching rate, CMOS-type logic circuits with low noise.

The stage 1 includes a pair of MOS transistors M1 and M2 which are associated to drive an output node 3. More particularly, the source electrode S1 of transistor M1 is connected to the drain electrode D2 of transistor M2, and these electrodes are both connected to the output node 3. The source S2 of transistor M2 is connected to ground, and the drain D1 of transistor M1 is connected to a power supply, not shown because it is conventional. Each transistor, M1 and M2, includes a conventional gate electrode G1 and G2, each being electrically connected to the output of respective circuit portions 4 and 5.

Circuit portions 4 and 5 include a pair of MOS transistors, M3 and M4, having their respective source and drain electrodes connected in parallel with each other. The drains D3 and D4 of each pair of transistors M3 and M4 are connected directly to each corresponding gate electrode G1 and G2.

The source electrodes of the first circuit portion 4 are connected to the output of an inverter 6 and the corresponding source electrodes of the other portion 5 are connected to the input of said inverter 6. Provided upstream of said inverter 6 is an additional inverter 7 which has its output connected to the drain electrodes of a pair of MOS transistors M5 and M6 having their respective source and drain electrodes connected in parallel. The source electrodes of transistors M5 and M6 constitute a signal input node 2 for the stage 1.

Advantageously, according to this invention, the data output stage 1 includes first feedback loop 8 and second feedback loop 9, which are structurally independent and respectively connected between the output node 3 and a corresponding gate electrode G1 and G2 of each transistor M1 and M2. The first loop 8 includes an inverter 10 having its input connected to the node 3 and its output connected to the gate G1. The second loop 9 comprises a pair of inverters 11 and 12 connected serially to each other, with the input of the inverter 11 being connected to the node 3 and the output of the inverter 12 to the gate G2.

The circuit structure of this invention allows the output node 3 to be precharged irrespective of the type of stage 1 switching.

The circuit structure of this invention allows the capacitive load on the node 3 to be brought to an intermediate voltage between a logic low and a logic high consistent with logics coupled to node 3, such as a TTL type.

In the preferred embodiment shown, the threshold voltage of each loop 8 and 9 is selected to bring the output node 3 to an intermediate voltage value between a logic low and a logic high switching level. In logics of the TTL type, the preferred intermediate voltage of about 1.4 Volts is suitable, though other values could be selected if desired. With the inventive circuit, this will occur independently of the voltage value appearing at the load connected to the node 3.

The transistor M1 operates as a pull-up for the output stage 1, whereas the other transistor M2 operates as a pull-down.

The threshold voltage of the loop 8 is selected to be about 1.3 Volts, and that of the lower loop 9 is set at a value of 1.6 Volts. In this way, the loops 8 and 9 are cooperatively independent so as to avoid undesired oscillations.

To illustrate circuit operations, assume a starting state of a logic high being present on the output 3 and M3 and M4 being off. The pull-down transistor M2 will be enabled because of the loop 9 threshold being set at 1.6 Volts. Under this condition, the node 3 will commence to discharge down towards the threshold voltage Vs. Due to the propagation of delay of the inverters 11 and 12, the transistor M2 is turned off on the node 3 reaching a voltage value of 1.4 Volts.

Assuming, on the other hand, that in a starting condition, the output 3 is at a logic low, the pull-up transistor M1 will be enabled, and the node 3 charged up to the threshold voltage value present at the upper loop 8. The turn-off delay of the transistor M1 is less than that of the transistor M2, and accordingly, even during this operating condition, the voltage value present at the node 3 will be about 1.4 Volts. The feedback loops 8 and 9 will not be simultaneously operational in either of these examples of operation. This will precharge the node 3 to an intermediate voltage level on desire. The size, threshold value, and propagation delay are selectable at any desired value to achieve a selected intermediate voltage level, depending on the type of logic at the output stage 3.

Node 3 is held at the selected intermediate voltage while transistors M3 and M4 are off. The voltage will stabilize at this selected voltage after a short time, and the current will drop to zero. When valid data is presented at node 2, transistors M3 and M4 are switched on and the voltage level at node 3 is controlled by the data presented at input node 2, whether high or low.

Transistors M5 and M6 are also on, to transfer the data from input node 2 to the input of the inverter 7. The transistors M5 and M6 are not always required and need not be present in all circuits embodying the invention.

The output stage of this invention allows the current peak which appears during the switching step to be lowered, thereby providing a reduction in the noise on the power supplies.

Actual tests carried out have permitted the circuits to be analyzed both in terms of gain and phase edge in comparison with circuits according to the prior art.

Figure 2:
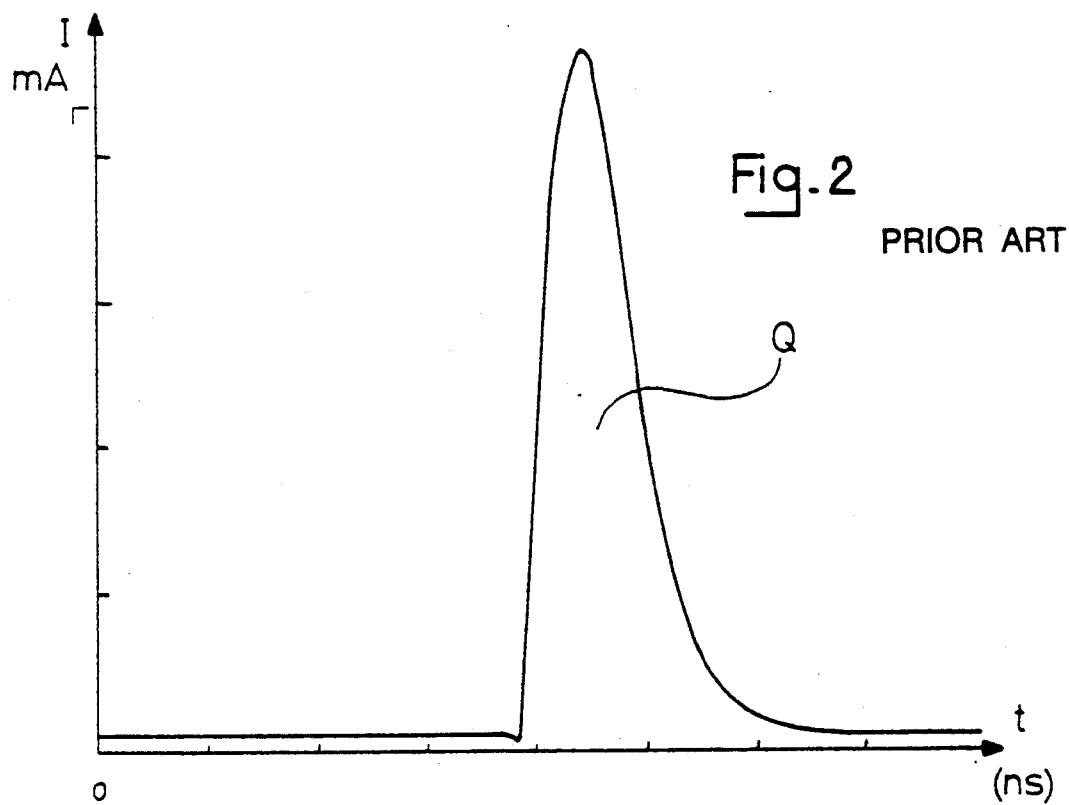
FIGS. 2 consists of graphs of the current values which appear in the output stage in circuits of the prior art.
Figure 3:
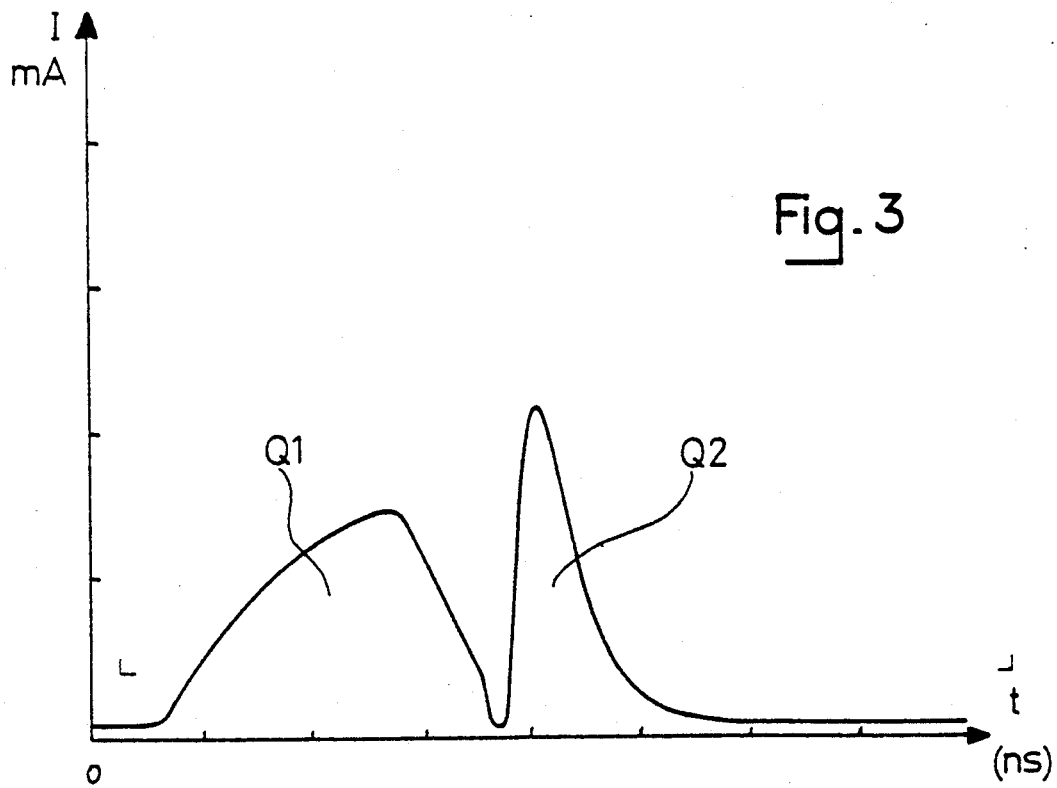
FIG. 3 is a graph of the current values which appear in the output stage in the circuit of FIG. 1.

For demonstration purposes, plotted in FIGS. 2 and 3 are the behaviors of the switching current value vs. time, for conventional circuits and the circuit of this invention, respectively.

As shown in FIG. 2, the maximum current peak is quite high in prior art circuits, creating noise.

As shown in FIG. 3, the maximum current peak is quite low and is spread over a longer time period.

In the inventive circuit, the charge Q=Q1+Q2 of the output capacitor C is scattered over a longer time period than in circuits of conventional design. The capacitor C is shown to illustrate the capacitance of the circuit coupled to output node 3 and receiving the data. The capacitance of C varies based on the circuit receiving the data, which depends on the type and design of that circuit and does not form a part of this invention. The inventive circuit effectively lowers the current peak during the switching phase.

The first output curve Q1 occurs with M3 and M4 off. After a brief period of time, the output will stabilize at the intermediate voltage and the current will be zero. The current Q1 represents current flow through either M1 or M2 as the voltage at node 3 is brought to the intermediate level. At the intermediate voltage level, both M1 and M2 are off and the current is zero. The current remains zero until M3 and M4 are switched on, which may be a short period of time or a long period of time. The output node is then pulled either high or low, depending on the value of the data. Curve Q2 represents the current flow as the voltage at node 3 is switched to the value of the data.

As can be appreciated, the peak current of Q2 will be lower than the prior art whether the data is high or low because the voltage is starting out at a value halfway between high and low.

While it is preferred that data be on node 2 before transistors M3 and M4 are switched on, this is not always required. The precharge towards the intermediate voltage may began and valid data be presented at node 2 before node 3 is fully at the intermediate voltage to provide increased switching speed. In this embodiment, the peak current is also reduced below that of the prior art.

While a preferred embodiment has been shown and described, it will be apparent that variations of the circuit may be made which fall within the scope of the invention to precharge the output node to a selected intermediate voltage level.

We claim:

1. A data output stage of the buffer type, having a low noise to ground and adapted for CMOS logic circuits of the type which comprises at least one pair of MOS transistors associated to drive an output node of said stage, characterized in that it comprises first and second feedback loops which are respectively connected between said output node and a corresponding gate electrode of each transistor to precharge said output node to a predetermined voltage level, the first feedback loop operating to raise the output node voltage towards the predetermined voltage level when the output node voltage is below a first selected threshold voltage, and the second feedback loop operating to lower the output node voltage towards the precharge voltage when the output node voltage is above a second selected threshold voltage.

2. An output stage according to claim 1, characterized in that said first loop comprises an inverter.

3. An output stage according to claim 1, characterized in that said second loop comprises a pair of inverters connected serially to each other.

4. An output stage according to claim 1 further including a first pair of transistors having their outputs coupled together and coupled to the gate one of said MOS transistors and a second pair of transistors having their outputs coupled together and coupled to the gate of other of said MOS transistor.

5. The data output stage according to claim 1 wherein said first selected threshold voltage is lower than said second selected threshold voltage, said first and second threshold voltages being different from each other to ensure loop stability and avoid current consumption.

6. A data output stage of the buffer type comprising:
a pair of MOS transistors coupled together, each of the MOS transistors having a gate, the source of the first of said transistors coupled to the drain of the second of said transistors to form an output node;
a first switching means coupled to the gate of said first MOS transistor for placing a data signal on said gate;
a second switching means coupled to the gate of said second MOS transistor for placing a complementary data signal on the gate of said second transistor;
a precharge circuit means coupled to said output node for precharging the voltage of said output node towards an intermediate voltage level between a logic high and a logic low for a circuit attachable to said output node; and
a data input node coupled to an input of said first and an input of said second switching means for providing data to the data output stage.

7. The data output stage according to claim 6 wherein said precharge means includes a circuit element coupled to said output node.

8. The data output stage according to claim 6 wherein said circuit element includes:
a first feedback loop coupled between said output node and said gate of said first MOS transistor; and
a second feedback loop coupled between said output node and said gate of said second MOS transistor.

9. The data output stage according to claim 8 wherein said first feedback loop includes an invertor and said second feedback loop includes two invertors coupled in series to each other.

10. The data output stage according to claim 6 wherein said first switching means includes a pair of MOS transistors having their respective sources and drains connected in parallel with each other, the drains being connected to said gate of said first MOS transistor and being switchable to selectively couple data to said gate of said first MOS transistor.

11. The data output stage according to claim 6 wherein said precharge circuit includes:
a first feedback loop operating to raise the output node voltage when the output node voltage is below a first selected threshold voltage; and
a second feedback loop operating to lower the output node voltage when said output node voltage is above a second selected threshold voltage.

12. The data output stage according to claim 11 wherein said first selected threshold voltage is lower than said second selected threshold voltage, said first and second threshold voltages being slightly different from each other to ensure loop stability and avoid current consumption.

13. A method of precharging an output node of a data stage of the buffer type comprising:
removing data for said output node by switching off a data switch circuit coupled to the gates of a pair of output MOS transistors;
pulling the voltage level at said output node towards an intermediate voltage between a logic high and a logic low by placing sufficient voltage on the gate of one of said pair of output MOS transistors to turn said transistors on until said output node reaches said intermediate voltage;
turing said MOS transistors off to hold said output node at said intermediate voltage;
turning on said data switching circuit to present valid data on said gates of said pair of MOS transistors; and
turning on at least one of said pair of said output MOS transistors to change the voltage level of said output node from said intermediate voltage to the voltage logic level of said data.

14. The method according to claim 13 wherein said pulling of the voltage level of the output node towards the intermediate voltage is completed and said output node is at said intermediate voltage prior to said turning on of said switching current.

15. A data output stage of the buffer type, having low noise to ground and being adapted for CMOS logic circuits of the type which include at least one pair of MOS transistors associated to drive an output node of said stage, comprising:
first and second feedback loops which are respectively connected between the output node and a corresponding gate electrode of each transistor within said pair of MOS transistors to precharge the output node to a predetermined voltage level;
a first pair of switching transistors having the outputs coupled together and coupled to the gate of one of the MOS transistors and having their respective inputs coupled to a data input source; and
a second pair of transistors having their outputs coupled together and coupled to the gate of other of the MOS transistors and having their inputs coupled to a complementary data input source.

16. A data output stage of the buffer type comprising:
a pair of MOS transistors coupled together, each of the MOS transistors having a gate, the source of the first of said transistors coupled to the drain of the second of said transistors to form an output node;
a first switching means coupled to the gate of said first MOS transistor for placing a data signal on said gate, said first switching means including a pair of MOS transistors having their respective sources and drains connected in parallel with each other, the drains being connected to said gate of said first transistor and being switchable to selectively couple data to said gate of said first transistor;
a second switching means coupled to the gate of said second MOS transistor for placing a complementary data signal on the gate of said second MOS transistor, said second switching means including a pair of MOS transistors having their respective sources and drains connected in parallel with each other, the drains being connected to said gate of said second MOS transistors and being switchable to selectively couple complementary data to said gate of said second MOS transistor;
a precharge circuit means coupled to said output node for precharging the voltage of said output node towards an intermediate voltage level between a logic high and a logic low for a circuit attachable to said output node; and
a data input node coupled to an input of said first and an input of said second switching means for providing data.

17. A data output stage of the buffer type comprising:
a pair of MOS transistors coupled together, each of the MOS transistors having a gate, the source of the first of said transistors coupled to the drain of the second of said transistors to form an output node;

a first switching means coupled to the gate of said first MOS transistor for placing a data signal on said gate;

a second switching means coupled to the gate of said second MOS transistor for placing a complementary data signal on the gate of said second transistor;

a precharge circuit means coupled to said output node for precharging the voltage of said output node towards an intermediate voltage level between a logic high and a logic low for a circuit attachable to said output node; and a data input node coupled to an input of said first and an input of said second switching means for providing data; and a timing means for turning said first and second switching means on after data is present on said input node.

18. A data output stage of the buffer type comprising:

a pair of MOS transistors coupled together, each of the MOS transistors having a gate, the source of the first of said transistors coupled to the drain of the second of said transistors to form an output node;

a first switching means coupled to the gate of said first MOS transistor for placing a data signal on said gate;

a second switching means coupled to the gate of said second MOS transistor for placing a complementary data signal on the gate of said second transistor;

a precharge circuit means coupled to said output node for precharging the voltage of said output node towards an intermediate voltage level between a logic high and a logic low for a circuit attachable to said output node; and a data input node coupled to an input of said first and an input of said second switching means for providing data; and a timing means for turning said first and second switching means on after said output node reaches said intermediate voltage.

* * * * *

UNITED STATES PATENT AND TRADEMARK OFFICE
CERTIFICATE OF CORRECTION

PATENT NO. : 5,179,300
DATED : January 12, 1993
INVENTOR(S) : Paolo Rolandi, et. al.

It is certified that error appears in the above-indentified patent and that said Letters Patent is hereby corrected as shown below:

Column 5, claim 8, line 27, delete "claim 6" and substitute therefor-- claim 7--.

Signed and Sealed this

Twenty-first Day of November, 1995

Attest:

BRUCE LEHMAN

*Attesting Officer*  *Commissioner of Patents and Trademarks*